United States Patent [19]

Nishigai et al.

[11] Patent Number: 5,011,345
[45] Date of Patent: Apr. 30, 1991

[54] CONTOUR MACHINING METHOD AND APPARATUS FOR PRINTED CIRCUIT BOARD

[75] Inventors: Masao Nishigai, Ayase; Tamio Otani, Hadano; Yasuhiko Kanaya, Machida; Tetsuo Murakami, Atsugi, all of Japan

[73] Assignee: Hitachi Seiko Co., Ltd., Tokyo, Japan

[21] Appl. No.: 446,588

[22] Filed: Dec. 6, 1989

[30] Foreign Application Priority Data

Dec. 12, 1988 [JP] Japan .................. 63-312018

[51] Int. Cl.$^5$ .................................. B23C 1/00
[52] U.S. Cl. ........................ 409/132; 364/474.12; 364/474.17; 409/84; 409/134
[58] Field of Search ........... 409/80, 84, 112, 131, 409/132, 134, 123; 408/1 R, 6, 9, 10, 11; 364/474.12, 474.17

[56] References Cited

U.S. PATENT DOCUMENTS

| | | | |
|---|---|---|---|
| 3,259,023 | 7/1966 | Rieger et al. | 408/9 |
| 3,545,310 | 12/1970 | Porath et al. | 408/11 |
| 4,208,718 | 6/1980 | Chung | 409/80 |
| 4,351,029 | 8/1982 | Maxey et al. | 364/474.17 |
| 4,786,220 | 11/1988 | Fildes et al. | 409/134 |

*Primary Examiner*—Daniel W. Howell
*Attorney, Agent, or Firm*—Antonelli, Terry, Stout & Kraus

[57] ABSTRACT

A method of machining the contour of a printed circuit board by effecting a relative feed movement between a rotating tool and the other periphery of the printed circuit board. The electrical current value of a drive motor for driving a spindle to which the tool is attached is detected and an operation is conducted for changing the machining condition in such a manner as to reduce the electrical current value of the spindle drive motor and, at the same time, for changing also tool diameter compensation amount to a value corresponding to the machining condition after the change, at every time the detected electrical current value has reached a predetermined current value immediately before tool breakage and repeatedly by a predetermined number of times.

4 Claims, 4 Drawing Sheets

F I G. 2
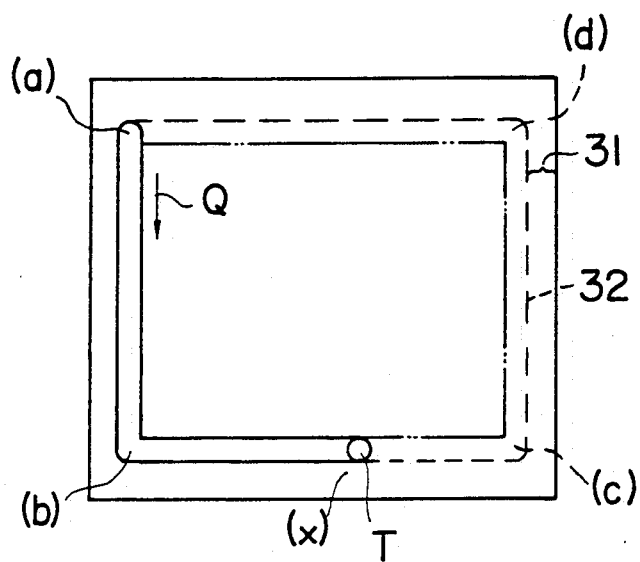
F I G. 3
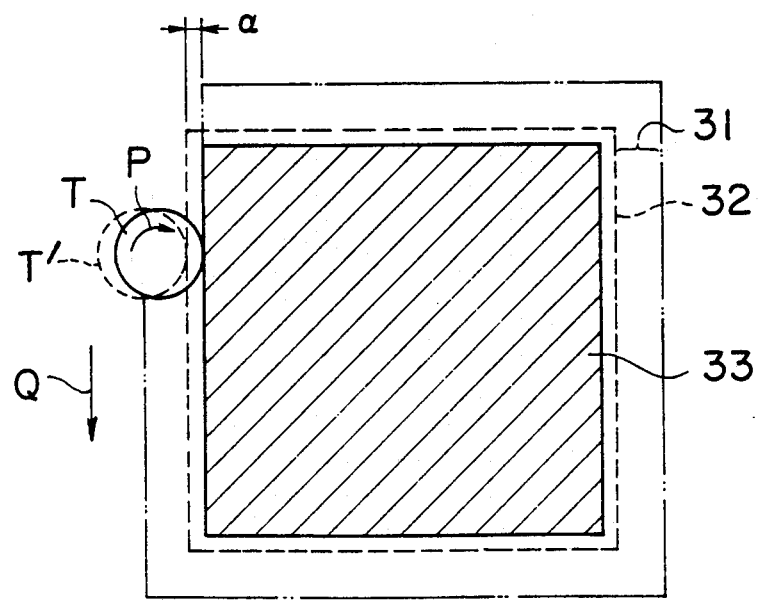

CONTOUR MACHINING METHOD AND APPARATUS FOR PRINTED CIRCUIT BOARD

BACKGROUND OF THE INVENTION

1. Field of the Invention

The present invention relates to a method and apparatus for machining a peripheral portion of a printed circuit board so as to work out the contour of the printed circuit board by effecting a relative feed movement between a rotating tool and the printed circuit board, and more particularly, to a contour machining method and apparatus intended to prolong the life of the tool while eliminating any machining failure.

2. Description of the Prior Art

Hitherto, the life of a machining tool (hereafter, referred to as tool) for contour machining of printed circuit boards has been detected by comparing the total machining distance of the tool in use with a predetermined value which has been set in accordance with experience. When the total machining distance of the tool has exceeded this predetermined value, the tool life is deemed to have expired and renewal of the tool is carried out.

The life of the tool, however, varies according to various factors such as the machining speed (feed speed), tool rotation speed and so forth, so that the total machining distance alone cannot provide a satisfactory base for the determination of the life of the tool. Therefore, the above-mentioned set value of the total machining distance, which is deemed to be the tool life, is often too large or small. When the set value is too large, there is a risk that the tool is broken during the machining, resulting in a defective product. On the other hand, when the set value is too small, the tool is used wastefully although the risk of breakage of the tool during machining is eliminated.

Under these circumstances, several methods have been proposed in which electrical current value of a motor for driving a spindle to which the tool is attached is detected and the machining conditions are changed in accordance with the detected electrical current value thereby to prolong the life of the tool. In these known methods, however, no specific consideration is given to the amount of compensation of the tool diameter peculiar to machining of the printed circuit board. In consequence, there is a problem in that the machining precision is undesirably lowered.

SUMMARY OF THE INVENTION

Accordingly, an object of the present invention is to provide a contour machining method and apparatus for printed circuit board in which the machining conditions are optimized in accordance with the state of the tool so as to prolong the life of the tool, while enabling machining without reducing the precision.

The above-mentioned object is achieved by detecting the electrical current value of a drive motor for driving a spindle to which a machining tool is attached and conducting an operation for changing the machining condition in such a manner so as to reduce the electrical current value of the spindle drive motor and, at the same time, for changing also tool diameter compensation amount to a value corresponding to the machining condition after the change, every time the detected electrical current value of the spindle drive motor has reached a predetermined current value immediately before tool breakage and repeatedly by a predetermined number of times.

It has been experimentally determined that the state in which a tool is going to be broken is detected by detecting the electrical current value of a drive motor for driving a spindle to which the tool is attached. It has been determined that the life of the tool can be prolonged by suitably selecting the machining condition, e.g., machining speed or feed speed, the rotation speed of the tool, and so forth. It is therefore possible to avoid breakage of a tool so as to prolong the life of the tool by changing the machining condition so as to reduce the electrical current value of the spindle drive motor immediately before the electrical current value reaches a value which indicates the possibility of breakage of the tool. Further, when the machining condition is changed the required amount of compensation of the tool diameter becomes changed and, therefore, the amount of compensation of the tool diameter is changed concurrently therewith. In this manner, it is possible to machine a plurality of workpieces at the same precision without requiring renewal of the tool.

BRIEF DESCRIPTION OF THE DRAWINGS

FIG. 2 and FIG. 3 are top plan schematic views of a workpiece for explaining the manner in which, in the present invention, a tool is renewed and the machining is restarted after n-th cycle of changes of the machining speed and the tool diameter compensation amount.

DESCRIPTION OF THE PREFERRED EMBODIMENTS

Before commencing the description of an embodiment, a general description will be given of the concepts of the machining condition and tool diameter compensation amount in the method of the invention, as well as the principle of the present invention, with specific reference to FIGS. 3 to 7.

Figure 4:
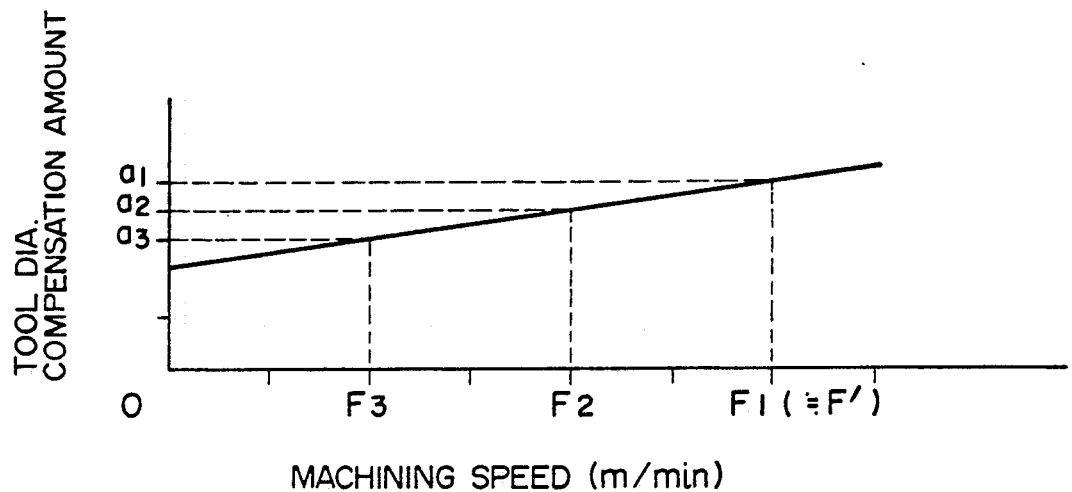
FIGS. 4 to 7 are graphical illustrations for explaining the concepts of machining condition and tool diameter compensation amount in the contour machining method of the invention for a printed circuit board, and the principle of the present invention.

Referring first to FIG. 3, a region 31 between the broken line and two-dot-and-dash line is a blank portion of a printed circuit board, with the broken line representing the required contour size 32 of the product, and the reference characters T, T' respectively representing a tool at different positions. It may be considered that the product having the required contour size 32 is obtained by moving the tool T' along the broken line representing the required contour size 32 of the product. Actually, however, as shown in FIG. 3 when the tool T is moved counterclockwise as indicated by an arrow Q along a predetermined path represented by two-dot-and-dash line while being rotated clockwise as indicated by an arrow P, with the tool applying a cutting force to the workpiece so as to reduce the size of the workpiece by an amount α as compared with the desired or required contour size 32, so that a product having a smaller size represented by the hatched area 33 is finally obtained. Therefore, it has been a common practice to move the tool along a path which is determined taking this amount α into account. This amount α is generally referred to as "tool diameter compensation amount" and varies in dependence upon the machining speed as shown in FIG. 4.

Figure 5:
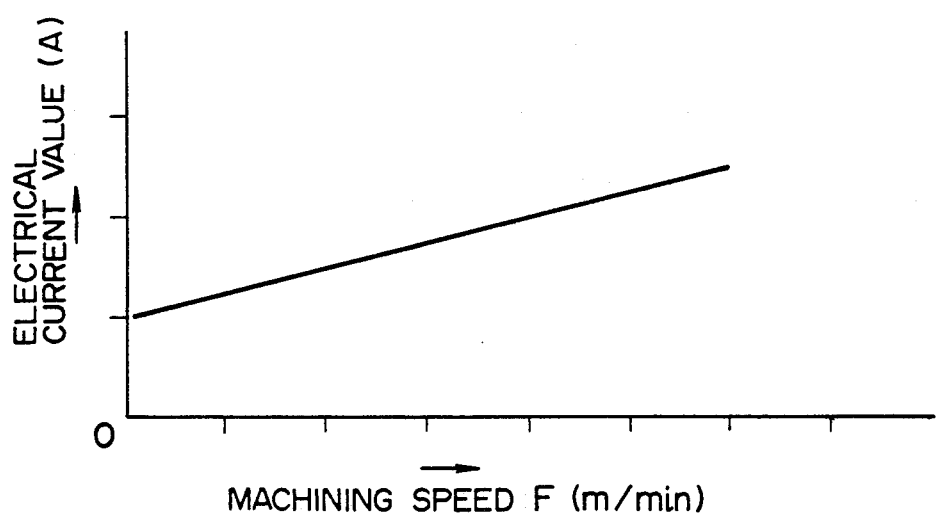

FIG. 5 is a graph showing the electrical current value (machining load) A of a spindle drive motor in relation to the machining speed F as observed when the tool rotation speed N is maintained constant with a given tool diameter $\phi D$. It will be seen from FIG. 5 that the higher the machining speed the greater the current value A of the spindle drive motor.

Figure 6:
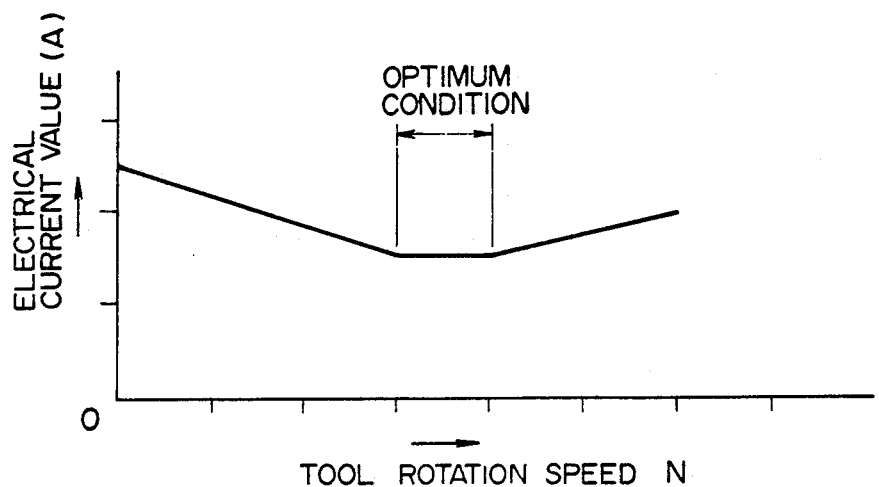

FIG. 6 is a graph showing the electrical current value A of a spindle drive motor in relation to the tool rotation speed as observed when the machining speed F is maintained constant with a given tool diameter $\phi D$. It will be seen from FIG. 6 that there is a certain optimum condition range in the current value A.

Figure 7:
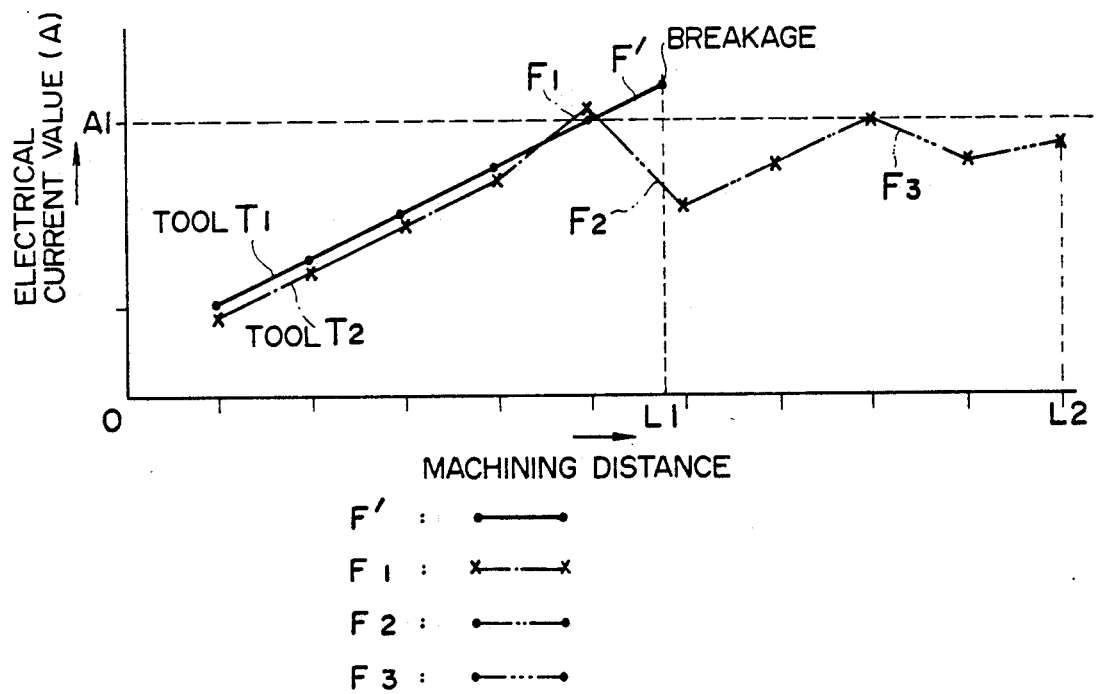

FIG. 7 is a graph which shows that, when the detected spindle drive motor current value A has reached a predetermined current value A1 corresponding to the state of the tool which is just going to be broken (referred to as "current value immediately before tool breakage"), the machining condition (machining speed F in this case) is changed in such a manner as to reduce the current value A, whereby the machining distance L indicative of the tool life is prolonged. The characteristics shown in FIG. 7 were obtained by experiments. More specifically, FIG. 7 shows the operating conditions of two tools $T_1$ and $T_2$. Namely, one of the tools $T_1$ was permitted to continuously operate at the constant machining speed F (=F') even after the current value A1 immediately before the tool breakage was reached, whereas, the machining speed of the other tool $T_2$ was reduced in a stepped manner from F1 to F2 and then to F3 (F1 > F2 > F3) every time the current value A1 immediately before the tool breakage was reached. As shown in FIG. 7 while the tool T1 was broken at the machining distance L1, the machining distance L of the tool $T_2$ was extended to $L_2$ by reducing the machining speed F from F1 to F2 when the current value A1 immediately before the tool breakage was reached for the first time and then further reducing the machining speed F to F3 when the current value A1 immediately before the tool breakage was reached for the second time.

Figure 1:
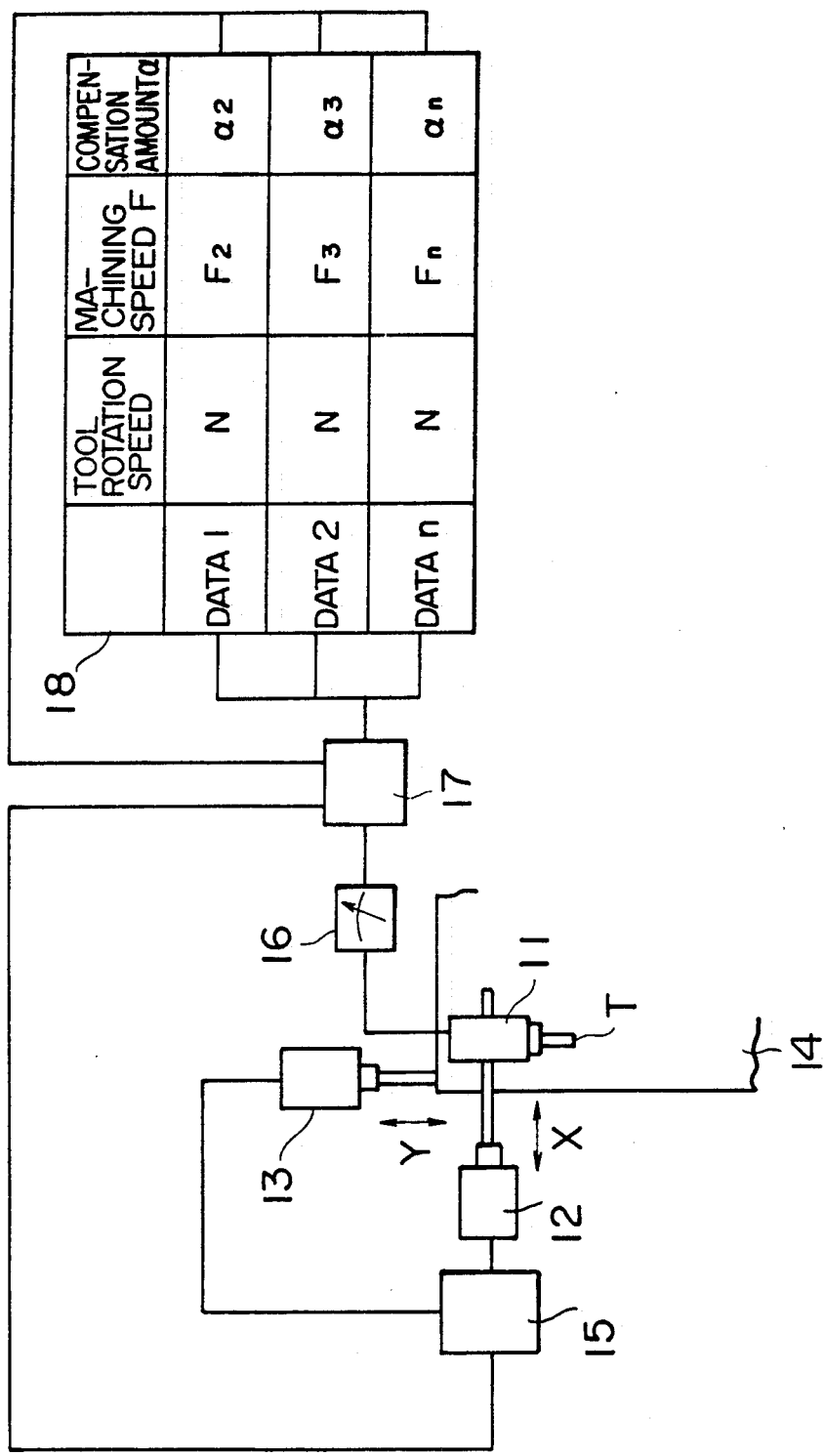
FIG. 1 is a block diagram showing an embodiment of the apparatus in accordance with the present invention.

As shown in FIG 1, the printed circuit board contour machining apparatus in accordance with the present invention has a tool T attached to a spindle which, in turn, is driven by a spindle drive motor 11. The spindle is constructed here as a unit with the drive motor, so that the motor is referred to as "spindle motor". A spindle feed motor 12 feeds the spindle motor 11 in the direction of the X-axis, a table feed motor 13 feeds the table 14 in the direction of Y-axis, and a machining controller 15 controls the feed motors 12, 13 and other components in accordance with machining instructions.

A current detector 16 detects the current value A of the spindle motor 11 (spindle motor current value). A machining condition/tool diameter compensation amount controller 17 is capable of performing, when the current value A detected by the current detector 16 has reached the current value A1 immediately before the tool breakage, a change in the machining condition in such a manner as to reduce the spindle motor current value A, as well as a change in the tool diameter compensation amount $\alpha$ in conformity with the machining condition after the change. In this embodiment, the change in the machining condition is to reduce the machining speed, while the change in the tool diameter compensation amount $\alpha$ is to reduce the amount $\alpha$ in conformity with the reduction in the machining speed. A memory 18 stores data 1 to n respectively including data concerning the machining speed F and the tool diameter compensation amount $\alpha$, and delivers in sequence this data to the controller 17 every time the current value A detected by the current detector 16 reaches the current value A1 immediately before the tool breakage. In FIG. 1, the tool rotation speed N is set to a constant value, while the machining speed F is in the relation of F2 > F3 > Fn and the tool diameter compensation amount $\alpha$ is in the relation of $\alpha 2 > \alpha 3 > \alpha n$.

Upon receipt of machining instructions, the controller 15 starts to operate the feed motors 12, 13 and the spindle motor 11 in accordance with the machining instructions, thereby commencing the machining operation. When the spindle motor current value A detected by the current detector 16 has reached the current value A1 immediately before the tool breakage, the machining condition/tool diameter compensation amount controller 17 reads the data 1 from the memory 18 and controls the controller 15 such that the machining speed F and the tool diameter compensation amount $\alpha$ are changed from F1 to F2 and from $\alpha 1$ to $\alpha 2$, respectively (F1 > F2, $\alpha 1 > \alpha 2$). Consequently, the controller 15 controls the feed motors 12 and 13 so as to effect the change in the machining speed F and the tool diameter compensation amount $\alpha$ to F2 and $\alpha 2$, respectively, so that the machining is executed with the reduced machining speed $F_2$ and the reduced tool diameter compensation amount $\alpha 2$.

As the machining is continued, the spindle motor current value A starts to rise again. When the current value A1 immediately before the tool breakage is again attained, the machining condition/tool diameter compensation amount controller 17 reads the data 2 from the memory 18 and controls the controller 15 such that the machining speed F and the tool diameter compensation amount $\alpha$ are changed from F2 to F3 and from $\alpha 2$ to $\alpha 3$, respectively. Consequently, the controller 15 controls the feed motors 12 and 13 so as to effect the change in the machining speed F and the tool diameter compensation amount $\alpha$ to F3 and $\alpha 3$, respectively, so that the machining is executed with the reduced machining speed $F_3$ and the reduced tool diameter compensation amount $\alpha 3$. This operation is repeated n times and, thereafter, the tool T is renewed (renewal can be executed automatically in this embodiment) and then the machining is restarted under a new condition.

According to the invention, therefore, it is possible to prolong the life of the tool T and to conduct the contour machining within a given range of machining precision by suitably setting the current value A1 (this is constant) immediately before tool breakage, the machining speeds F1 to Fn (Fn being selected to be the minimum speed within the range which is permissible from the economical point of view) and the tool diameter compensation amounts $\alpha 1$ to $\alpha n$, in compliance with the tool T in use.

After completion of n times of change in the machining speed F and the tool diameter compensation amount $\alpha$, the renewal of the tool T and the restarting of the machining with the new tool T are conducted, for example, in the following manner. Referring to FIG. 2, it is assumed that the machining of a workpiece has commenced from a point (a) and the current value A1 immediately before the tool breakage for the n-th time was reached at a point (x). In such a case, the machining is restarted after renewal of the tool as in the following methods (1) to (3) or, alternatively, for the workpiece (i.e., printed circuit board) under the present machining the machining is restarted without the renewal of the tool and the tool is renewed before the next machining as in the following methods (4) and (5).

(1) Machining is continued to the point (c) and then the tool is automatically renewed. Thereafter, the machining is restarted from the point (c) and the workpiece is machined to the point (a) via the point (d).

(2) The machining is stopped at the point (x) and, after an automatic renewal of the tool T, the machining is restarted from the point (a).

(3) Machining is continued to the point (a) past the points (c) and (d), and then the tool is automatically renewed.

(4) Machining is continued to the point (c). Then, the machining speed is further changed to a speed $Fn+1$ which is lower than the speed $Fn$. The machining is then restarted with the further reduced speed $Fn+1$ from the point (c) to the point (a) past the point (d). Thereafter, the tool is renewed. (This method is suitable for rough machining.)

(5) Machining is continued to the point (c). Then, the machining speed is further changed to a speed $Fn+1$ which is lower than the speed $Fn$ and, at the same time, the tool diameter compensation amount $\alpha$ is also changed to a value $\alpha_n+1$ which corresponds to the machining speed $Fn+1$ after the change and the machining is restarted from the point (a). Thereafter, the tool is renewed. (This method is suitable for fine machining.)

It will be clear to those skilled in the art that the machining speed $Fn$, which is used as an index of the tool life, is set with a certain degree of margin.

As will be understood from the foregoing description, according to the present invention, it is possible to set the optimum machining condition, in dependence on the state of the tool so as to prolong the life of the tool while continuing the machining without impairing the precision.

What is claimed is:

1. A method of machining the contour of a printed circuit board by effecting a relative feed movement between a rotating tool and the outer periphery of the printed circuit board, said method comprising: detecting the electrical current value of a drive motor for driving a spindle to which said tool is attached; and changing, when the detected electrical current value of said spindle drive motor has reached a predetermined current value immediately before tool breakage, the machining condition in such a manner as to reduce the electrical current value of said spindle drive motor and, at the same time, changing the tool diameter compensation amount to a value corresponding to the machining condition after the change.

2. A method of machining of the contour of a printed circuit board by effecting a relative feed movement between a rotating tool and an outer periphery of the printed circuit board, said method comprising:
detecting the electrical current value of a drive motor for driving a spindle to which said tool is attached; and conducting an operation for changing the machining condition in such a manner so as to reduce the electrical current value of said spindle drive motor and, at the same time, for changing the tool diameter compensation amount to a value corresponding to the machining condition after the change, at every time the detected electrical current value of said spindle drive motor has reached a predetermined current value immediately before tool breakage and repeatedly changing the current value and the tool diameter compensation amount a predetermined number of times.

3. An apparatus for machining the contour of a printed circuit board by effecting a relative feed movement between a rotating tool and the outer periphery of the printed circuit board, said apparatus comprising: a current detector for detecting the electrical current value of a drive motor for driving a spindle to which said tool is attached; and machining condition/tool diameter compensation amount controller for changing, when the electrical current value of said spindle drive motor detected by said current detector has reached a predetermined current value immediately before tool breakage, the machining condition in such a manner as to reduce the electrical current value of side spindle drive motor and, at the same time, changing also the tool diameter compensation amount to a value corresponding to the machining condition after the change.

4. An apparatus for machining the contour of a printed circuit board by effecting a relative feed movement between the rotation tool and the outer periphery of the printed circuit board, said apparatus comprising:
a current detector for detecting the electrical current value of a drive motor for driving a spindle to which said tool is attached; and machining condition/tool diameter compensation amount controller means for conducting an operation for changing the machining condition in such a manner so as to reduce the electrical current value of said spindle drive motor and, at the same time, for changing the tool diameter compensation amount to a value corresponding to the machining condition after the change, at every time the electrical current value of said spindle drive motor detected by said current detector has reached a predetermined current value immediately before tool breakage and repeatedly changing the current value and the tool diameter compensation amount a predetermined number of times.

* * * * *